(12) United States Patent
Lee

(10) Patent No.: US 8,018,058 B2
(45) Date of Patent: Sep. 13, 2011

(54) SEMICONDUCTOR MEMORY DEVICE

(75) Inventor: Sang-Yun Lee, Beaverton, OR (US)

(73) Assignee: BeSang Inc., Beaverton, OR (US)

( * ) Notice: Subject to any disclaimer, the term of this patent is extended or adjusted under 35 U.S.C. 154(b) by 1202 days.

(21) Appl. No.: 11/092,500

(22) Filed: Mar. 29, 2005

(65) Prior Publication Data

US 2005/0280154 A1 Dec. 22, 2005

Related U.S. Application Data

(63) Continuation-in-part of application No. 10/873,969, filed on Jun. 21, 2004, now Pat. No. 7,052,941.

(51) Int. Cl.
H01L 23/48 (2006.01)
(52) U.S. Cl. .......................... 257/758; 257/759
(58) Field of Classification Search .................. 257/758, 257/759, 760, 761, 762, 330–334
See application file for complete search history.

(56) References Cited

U.S. PATENT DOCUMENTS

| | | | | |
|---|---|---|---|---|
| 4,680,085 A | * | 7/1987 | Vijan et al. | 438/482 |
| 4,704,785 A | | 11/1987 | Curran | |
| 4,732,312 A | | 3/1988 | Kennedy et al. | |
| 4,829,018 A | | 5/1989 | Wahlstrom | |
| 4,854,986 A | | 8/1989 | Raby | |
| 4,982,266 A | * | 1/1991 | Chatterjee | 257/66 |
| 5,087,585 A | | 2/1992 | Hayashi | |
| 5,106,775 A | * | 4/1992 | Kaga et al. | 438/155 |
| 5,152,857 A | | 10/1992 | Ito et al. | |
| 5,250,460 A | | 10/1993 | Yamagata et al. | |
| 5,266,511 A | | 11/1993 | Takao | |
| 5,277,748 A | | 1/1994 | Sakaguchi et al. | |
| 5,311,050 A | * | 5/1994 | Nitayama et al. | 257/330 |
| 5,324,980 A | | 6/1994 | Kusunoki | |
| 5,355,022 A | | 10/1994 | Sugahara et al. | |
| 5,371,037 A | | 12/1994 | Yonehara | |
| 5,374,564 A | | 12/1994 | Bruel | |
| 5,374,581 A | | 12/1994 | Ichikawa et al. | |
| 5,554,870 A | | 9/1996 | Fitch et al. | |
| 5,563,084 A | | 10/1996 | Ramm et al. | |
| 5,617,991 A | | 4/1997 | Pramanick et al. | |
| 5,695,557 A | | 12/1997 | Yamagata et al. | |
| 5,731,217 A | * | 3/1998 | Kadosh et al. | 438/300 |
| 5,854,123 A | | 12/1998 | Sato et al. | |
| 5,882,987 A | | 3/1999 | Srikrishnan | |
| 5,915,167 A | * | 6/1999 | Leedy | 438/108 |
| 5,937,312 A | | 8/1999 | Iyer et al. | |
| 5,977,579 A | * | 11/1999 | Noble | 257/302 |
| 5,980,633 A | | 11/1999 | Yamagata et al. | |
| 5,998,808 A | | 12/1999 | Matsushita | |
| 6,057,212 A | | 5/2000 | Chan et al. | |
| 6,103,597 A | | 8/2000 | Aspar et al. | |
| 6,153,495 A | | 11/2000 | Kub et al. | |
| 6,222,251 B1 | | 4/2001 | Holloway | |
| 6,229,161 B1 | | 5/2001 | Nemati et al. | |
| 6,242,324 B1 | | 6/2001 | Kub et al. | |
| 6,331,468 B1 | | 12/2001 | Aronowitz et al. | |

(Continued)

*Primary Examiner* — Thinh T Nguyen
(74) *Attorney, Agent, or Firm* — Schmeiser Olsen & Watts LLP

(57) ABSTRACT

A method of forming a circuit includes providing a substrate; providing an interconnect region positioned on the substrate; bonding a device structure to a surface of the interconnect region; and processing the device structure to form a first stack of layers on the interconnect region and a second stack of layers on the first stack. The width of the first stack is different than the width of the second stack.

74 Claims, 14 Drawing Sheets

U.S. PATENT DOCUMENTS

| | | |
|---|---|---|
| 6,380,046 B1 | 4/2002 | Yamazaki |
| 6,380,099 B2 | 4/2002 | Sakaguchi et al. |
| 6,417,108 B1 | 7/2002 | Akino et al. |
| 6,423,614 B1 | 7/2002 | Doyle |
| 6,429,484 B1 * | 8/2002 | Yu ................................ 257/347 |
| 6,534,382 B1 | 3/2003 | Sakaguchi et al. |
| 6,545,297 B1 * | 4/2003 | Noble et al. .................. 257/124 |
| 6,555,901 B1 | 4/2003 | Yoshihara et al. |
| 6,600,173 B2 * | 7/2003 | Tiwari ............................ 257/74 |
| 6,630,713 B2 | 10/2003 | Geusic |
| 6,635,552 B1 | 10/2003 | Gonzalez |
| 6,638,834 B2 | 10/2003 | Gonzalez |
| 6,653,209 B1 | 11/2003 | Yamagata |
| 6,661,085 B2 | 12/2003 | Kellar et al. |
| 6,762,076 B2 | 7/2004 | Kim et al. |
| 6,774,010 B2 | 8/2004 | Chu et al. |
| 6,806,171 B1 | 10/2004 | Ulyashin et al. |
| 6,809,009 B2 | 10/2004 | Aspar et al. |
| 6,844,243 B1 | 1/2005 | Gonzalez |
| 6,864,534 B2 | 3/2005 | Ipposhi et al. |
| 6,943,067 B2 * | 9/2005 | Greenlaw ...................... 438/152 |
| 6,995,430 B2 | 2/2006 | Langdo et al. |
| 7,052,941 B2 | 5/2006 | Lee |
| 7,067,396 B2 | 6/2006 | Aspar et al. |
| 7,078,739 B1 * | 7/2006 | Nemati et al. ................. 257/107 |
| 7,109,092 B2 | 9/2006 | Tong |
| 7,148,119 B1 | 12/2006 | Sakaguchi et al. |
| RE39,484 E | 2/2007 | Bruel |
| 7,217,636 B1 | 5/2007 | Atanackovic |
| 7,245,002 B2 | 7/2007 | Akino et al. |
| 7,256,104 B2 | 8/2007 | Ito et al. |
| 7,378,702 B2 * | 5/2008 | Lee ............................... 257/296 |
| 7,470,142 B2 | 12/2008 | Lee |
| 7,470,598 B2 | 12/2008 | Lee |
| 7,632,738 B2 | 12/2009 | Lee |
| 7,633,162 B2 | 12/2009 | Lee |
| 7,671,371 B2 | 3/2010 | Lee |
| 7,709,932 B2 | 5/2010 | Nemoto et al. |
| 7,718,508 B2 | 5/2010 | Lee |
| 7,799,675 B2 | 9/2010 | Lee |
| 7,800,199 B2 | 9/2010 | Oh et al. |
| 7,846,814 B2 | 12/2010 | Lee |
| 7,867,822 B2 | 1/2011 | Lee |
| 7,888,764 B2 | 2/2011 | Lee |
| 2002/0025604 A1 | 2/2002 | Tiwari |
| 2003/0102079 A1 | 6/2003 | Kalvesten et al. |
| 2003/0119279 A1 | 6/2003 | Enquist |
| 2003/0205480 A1 | 11/2003 | Sakaguchi et al. |
| 2003/0224582 A1 | 12/2003 | Shimoda et al. |
| 2004/0147077 A1 | 7/2004 | Watanabe et al. |
| 2004/0259312 A1 | 12/2004 | Schlosser et al. |
| 2004/0262635 A1 * | 12/2004 | Lee ............................... 257/199 |
| 2005/0280154 A1 | 12/2005 | Lee |
| 2005/0280155 A1 | 12/2005 | Lee |
| 2005/0280156 A1 | 12/2005 | Lee |
| 2006/0121690 A1 | 6/2006 | Pogge et al. |
| 2006/0275962 A1 | 12/2006 | Lee |
| 2007/0072391 A1 | 3/2007 | Pocas et al. |
| 2007/0190746 A1 | 8/2007 | Ito et al. |
| 2007/0262457 A1 | 11/2007 | Lin |
| 2008/0032463 A1 | 2/2008 | Lee |
| 2008/0048327 A1 | 2/2008 | Lee |
| 2009/0267233 A1 | 10/2009 | Lee |
| 2010/0038743 A1 | 2/2010 | Lee |
| 2010/0133695 A1 | 6/2010 | Lee |
| 2010/0190334 A1 | 7/2010 | Lee |
| 2011/0001172 A1 | 1/2011 | Lee |
| 2011/0003438 A1 | 1/2011 | Lee |
| 2011/0053332 A1 | 3/2011 | Lee |

* cited by examiner

SEMICONDUCTOR MEMORY DEVICE

CROSS REFERENCE TO RELATED APPLICATIONS

This is a continuation-in-part of application Ser. No. 10/873,969, entitled "THREE-DIMENSIONAL INTEGRATED CIRCUIT STRUCTURE AND METHOD OF MAKING SAME", which was filed 21 Jun. 2004 and issued as U.S. Pat. No. 7,052,941, and is incorporated in its entirety herein by reference. U.S. Pat. No. 7,052,941 claims priority to Korean Patent Application Nos. 10-2003-0040920 and 10-2003-0047515, which were filed on Jun. 24, 2003 and Jul. 12, 2003, respectively.

BACKGROUND OF THE INVENTION

1. Field of the Invention

This invention relates generally to semiconductor circuitry and, more particularly, to semiconductor memory devices.

2. Description of the Related Art

Advances in semiconductor manufacturing technology have provided computer chips with integrated circuits that include many millions of active and passive electronic devices, along with the interconnects to provide the desired circuit connections. As is well-known, most integrated circuits include laterally oriented active and passive electronic devices that are carried on a single major surface of a substrate. Active devices typically include transistors and passive devices typically include resistors, capacitors, and inductors. However, these laterally oriented devices consume significant amounts of chip area.

It is desirable to provide computer chips that can operate faster so that they can process more data in a given amount of time. The speed of operation of a computer chip is typically measured in the number of instructions per second it can perform. Computer chips can be made to process more data in a given amount of time in several ways. In one way, the number of devices included in the computer chip can be increased so that it can operate faster because more information can be processed in a given period of time. For example, if one computer chip operates on 32-bit data, then another computer chip that operates on 64-bit data can process information twice as fast because it can perform more instructions per second. However, the 64-bit computer chip will need more devices since there are more bits to process at a given time.

The number of devices can be increased by making the devices included therein smaller, but this requires advances in lithography and increasingly expensive manufacturing equipment. The number of devices can also be increased by keeping their size the same, but increasing the area of the computer chip. However, the yield of the computer chips fabricated in a run decreases as their area increases, which increases the overall cost.

Computer chips can also be made faster by decreasing the time it takes to perform certain tasks, such as storing and retrieving information to and from memory. The time needed to store and retrieve information to and from memory can be decreased by embedding the memory with the computer chip on the same surface as the other devices. However, there are several problems with doing this. One problem is that the masks used to fabricate the memory devices are not compatible with the masks used to fabricate the other devices on the computer chip. Hence, it is more complex and expensive to fabricate a computer chip with memory embedded in this way. Another problem is that memory devices tend to be large and occupy a significant amount of area. Hence, if most of the area on the computer chip is occupied by memory devices, then there is less area for the other devices. The total area of the computer chip can be increased, but as discussed above, this decreases the yield and increases the cost.

Accordingly, it is highly desirable to provide new structures and methods for fabricating computer chips which operate faster and are cost effective to fabricate.

BRIEF SUMMARY OF THE INVENTION

The present invention involves a circuit, and a semiconductor device. The invention will be best understood from the following description when read in conjunction with the accompanying drawings.

DETAILED DESCRIPTION OF THE INVENTION

Figure 1:
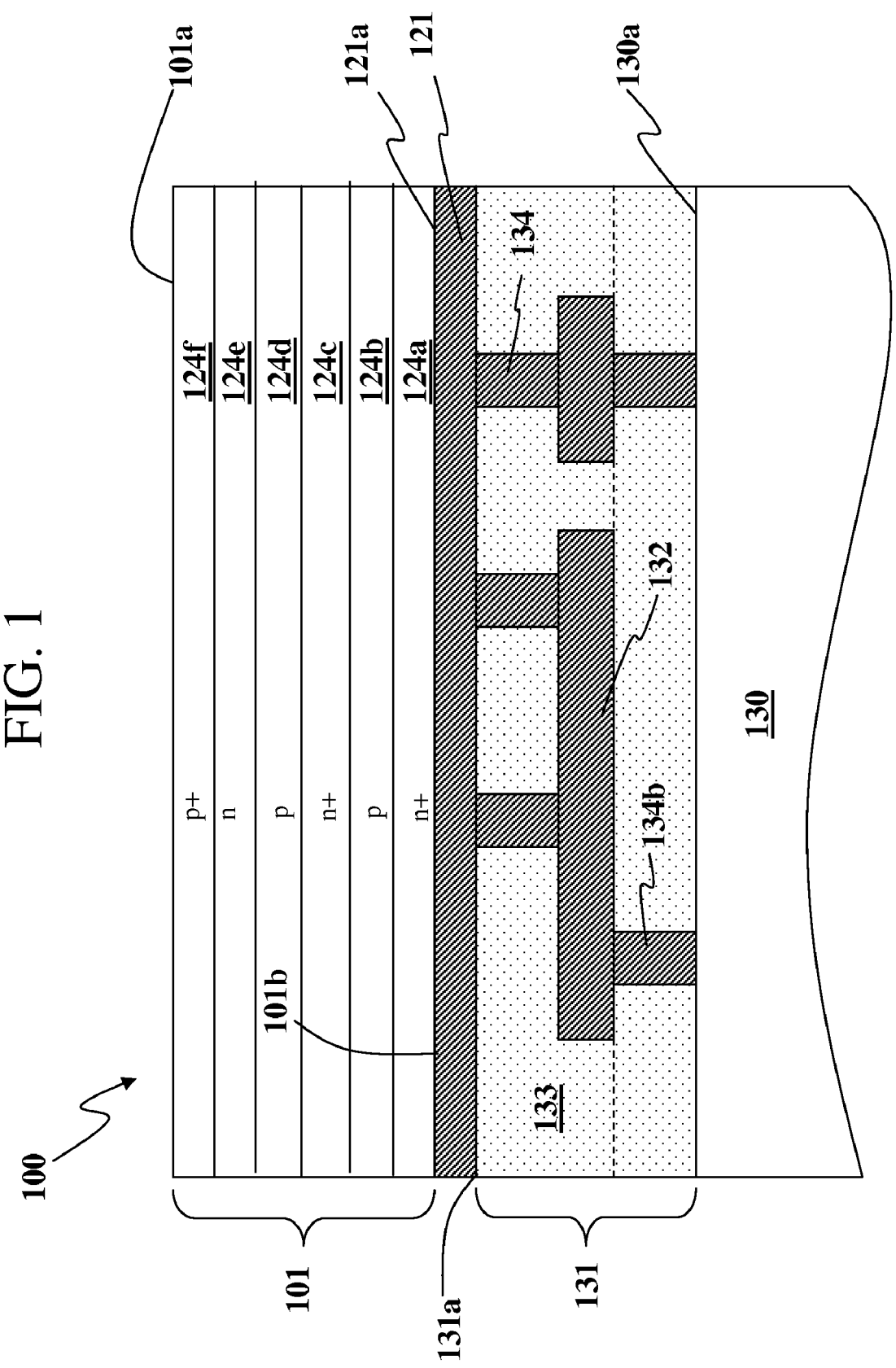
FIGS. 1-11 are simplified sectional views of steps in the fabrication of a memory device in accordance with the present invention.

FIGS. 1-12 are simplified sectional views of steps in fabricating a semiconductor memory circuit 100 in accordance with the present invention. In the following figures, like reference characters indicate corresponding elements throughout the several views. In FIGS. 1-12, only a few memory devices are shown in circuit 100, but it should be understood that circuit 100 generally includes a number of memory devices and that only a few are shown for simplicity and ease of discussion.

Circuit 100 can be included in a computer chip where the memory devices are positioned above the computer circuitry. The memory devices are typically coupled to the computer circuitry through interconnects which include a conductive line and/or a conductive via. Circuit 100 has several advantages. One advantage is that the memory devices are positioned above the computer circuitry which is desirable since the memory devices typically occupy much more area than the computer circuitry. Another advantage of circuit 100 is that the memory devices are positioned closer to the computer circuitry so that signals can flow therebetween in less time. Still another advantage of circuit 100 is that the computer circuitry are fabricated with a different mask set than the memory devices. Hence, the masks are less complicated and less expensive to make. A further advantage is that the memory devices are fabricated from blanket semiconductor layers after they have been bonded to the interconnect region. Hence, the memory devices do not need to be aligned with the computer circuitry, which is a complicated and expensive process.

In FIG. 1, partially fabricated circuit 100 includes an interconnect region 131 carried by a substrate 130. Interconnect region 131 provides support for structure positioned thereon its surface 131*a*. Interconnect region 131 includes a dielectric material region 133 with interconnect lines 132 and conductive vias 134. Dielectric material region 133 can be formed using many different methods, such as CVD (Chemical Vapor Deposition) and SOG (Spin On Glass). Typically interconnect lines 132 and vias 134 are coupled to electronic circuitry (not shown), such as CMOS circuitry, carried by substrate 130 near a surface 130a. Interconnect lines 132 and vias 134 include conductive materials, such as aluminum, copper, tungsten, tungsten silicide, titanium, titanium silicide, tantalum, and doped polysilicon, among others.

A conductive contact region 121 is positioned on surface 131a of region 131. Region 121 can include one or more material layers, however, it is shown here as including one layer for simplicity. Conductive contact region 121 can include many different types of conductive materials, such as a metal. In some embodiments, conductive contact region 121 is a metal conductive contact region. A device structure 101 is positioned on surface 121a of conductive contact region 121. Device structure 101 is spaced from via 134 by conductive contact region 121. In accordance with the invention, structure 101 is bonded to surface 121a using wafer bonding. In this way, device structure 101 is carried by conductive contact region 121. Device structure 101 is bonded to surface 121a to form a bonding interface therebetween. In some embodiments, the bonding interface is a metal-to-metal bonding interface. Device structure 101a includes opposed surfaces 101a and 101b. In one embodiment, surface 101b is a planarized surface. In some embodiments, surfaces 101a and 101b are planarized surfaces. Device structure 101 includes a planarized surface which faces conductive contact region 121 in the embodiments wherein surface 101b is a planarized surface. Device structure 101 includes a planarized surface which faces away from ledge 129 in the embodiments wherein surface 101b is a planarized surface. Device structure 101 includes a planarized surface which faces interconnect region 131 in the embodiments wherein surface 101b is a planarized surface. Device structure 101 includes a planarized surface which faces via 134 in the embodiments wherein surface 101b is a planarized surface. More information regarding wafer bonding and bonding interfaces can be found in U.S. Pat. No. 7,470,142, entitled "WAFER BONDING METHOD," which issued on Dec. 30, 2008 to the same inventor, the contents of which are incorporated by reference as though fully set forth herein. More information regarding wafer bonding and bonding interfaces can be found in U.S. patent application Ser. No. 11/092,501, entitled "SEMICONDUCTOR BONDING AND LAYER TRANSFER METHOD," filed on the same date herewith by the same inventor, the contents of which are incorporated by reference as though fully set forth herein.

In this embodiment, device structure 101 includes a stack of semiconductor layers which include an $n^+$-type doped layer 124a with a p-type doped layer 124b positioned on it. An $n^+$-type doped layer 124c is positioned on layer 124b and a p-type doped layer 124d is positioned on layer 124c. An n-type doped layer 124e is positioned on layer 124d and a $p^+$-type doped layer 124f is positioned on layer 124e. In this embodiment, these layers can be doped using diffusion doping, epitaxial growth, ion implantation, plasma doping, or combinations thereof. More information regarding wafer bonding can be found in U.S. Pat. No. 7,470,598, entitled "SEMICONDUCTOR LAYER STRUCTURE AND METHOD OF MAKING THE SAME," which issued on Dec. 30, 2008 to the same inventor, the contents of which are incorporated by reference as though fully set forth herein. In this invention, device structure 101 preferably includes single crystalline material which can have localized defects, but is generally of better quality than amorphous or polycrystalline material.

As mentioned above, surface 101b of device structure 101 is a planarized surface in some embodiments. In the embodiment of FIG. 1, the planarized surface corresponds to a surface of layer 124a which faces interconnect region 131. Hence, in some embodiments, planarized surface 101b corresponds to a surface of layer 124a which faces interconnect region 131. In the embodiment of FIG. 1, the planarized surface corresponds to a surface of layer 124a which faces conductive region 121. In some embodiments, planarized surface 101b corresponds to a surface of layer 124a which faces conductive region 121.

It should be noted that device structure 101 will be processed further, as shown in FIGS. 2-12, to form one or more desired device(s) which can be many different types. For example, the device(s) can include a memory device, such as a capacitorless Dynamic Random Access Memory (DRAM) device. In this particular example, the electronic device(s) include a Negative Differential Resistance (NDR) type Static Random Access Memory (SRAM) device, which has vertically and serially connected a thyristor and a MOSFET (Metal-Oxide Semiconductor Field-Effect-Transistor). As will be discussed in more detail below, the NDR SRAM device can operate faster and is more stable than a planar NDR SRAM device.

Figure 2:
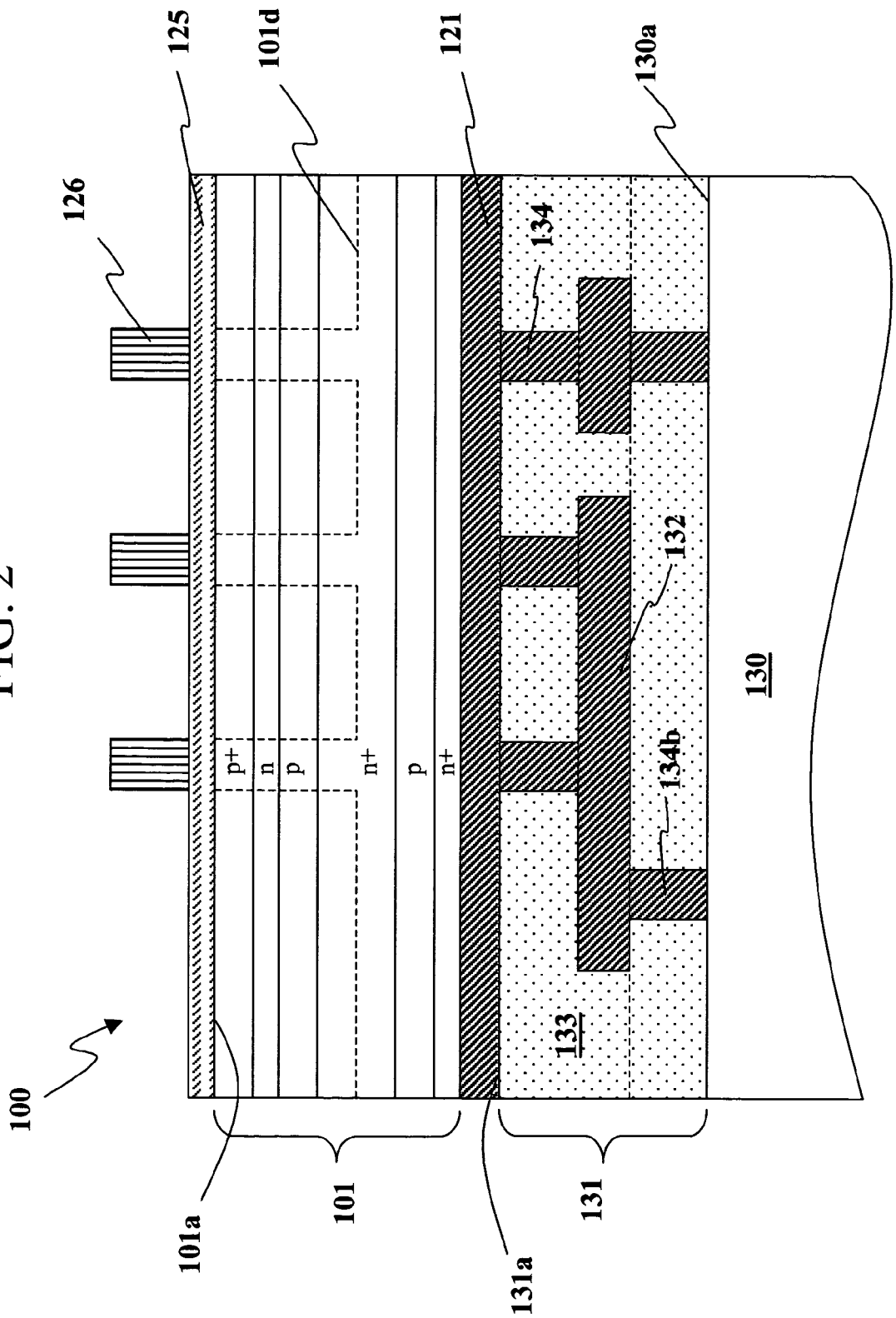
Figure 3:
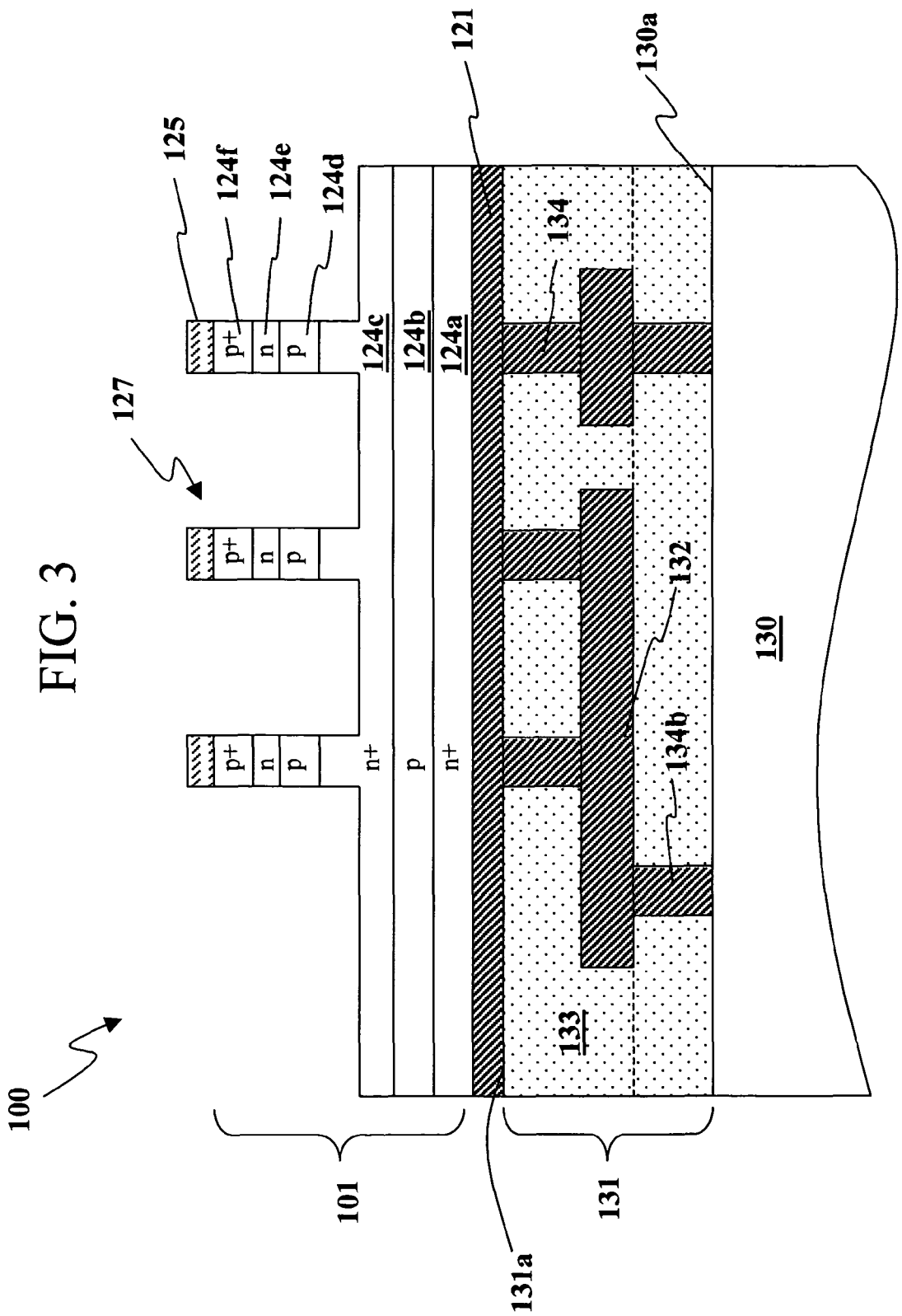

In FIG. 2, a hardmask region 125 is positioned on surface 101a of device structure 101 and a photoresist region 126 is positioned on hardmask region 125. Hardmask region 125 can include dielectric materials, such as silicon oxide and silicon nitride. Hardmask region 125 can also include anti-reflective films, such as high-K SiON, in order to reduce reflection during photo process. Photoresist region 126 is patterned and exposed using a photo mask (not shown) so that portions of it can be removed and other portions (shown) remain on hardmask region 125. Photoresist region 126 defines a top portion of the device to be fabricated, as indicated by a dotted line 101d. In FIG. 3, device structure 101 is partially etched in a known manner to form stacks 127 and photoresist region 126 is removed. Stacks 127 are formed because the etch does not substantially remove the material in region 101 below hardmask region 125.

Figure 4:
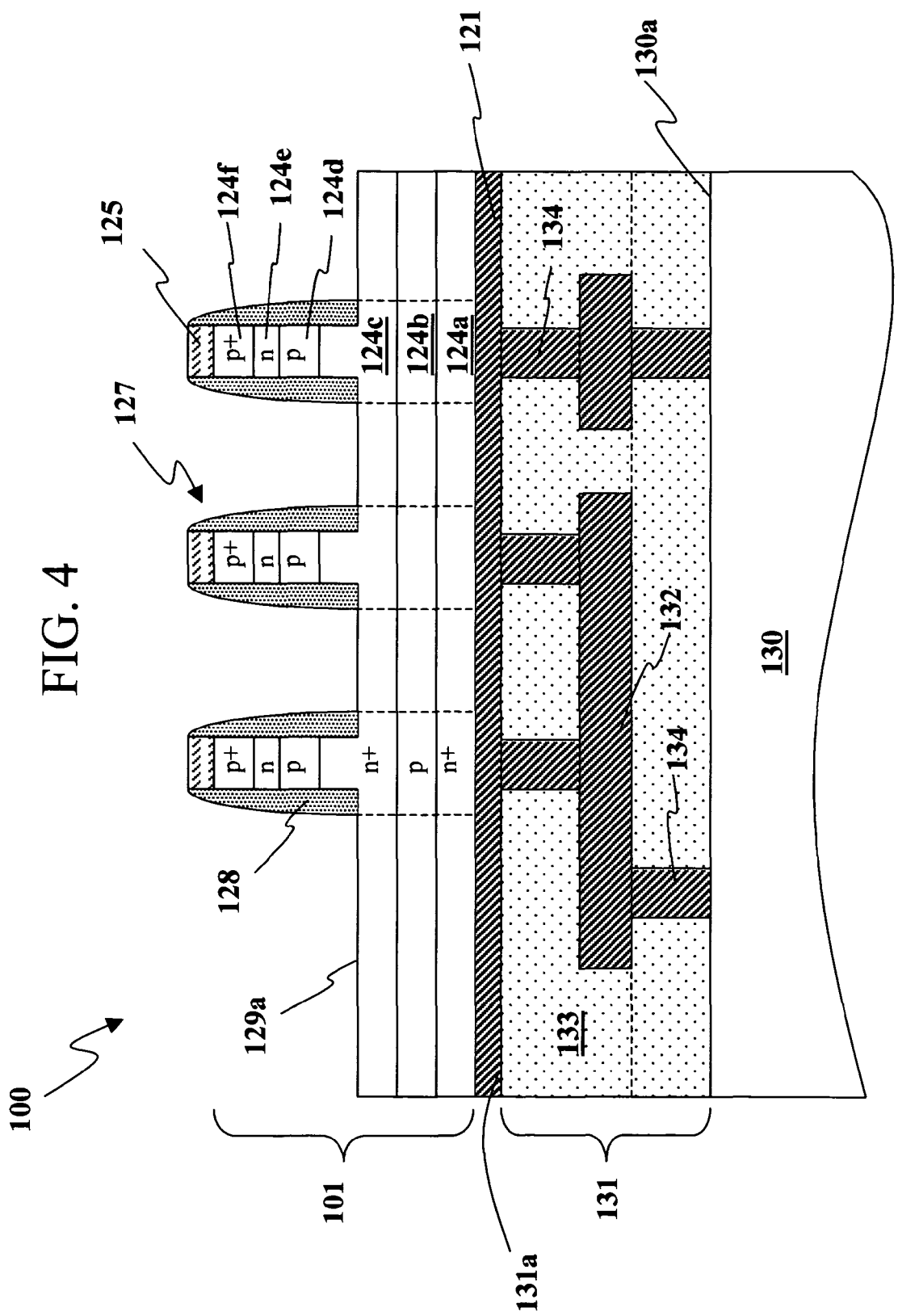

In FIG. 4, mask regions 128 are positioned around each stack 127. Mask regions 128 extend from a surface 129a of layer 124c to mask region 125 of each stack 127. Sidewall mask region 128 can include a dielectric material, such as oxide and/or nitride, deposited by CVD (Chemical Vapor Deposition), and dry etched to form the sidewall. Sidewall mask region 128 and mask 125 protect stack 127 and a portion of a surface 129a from a subsequent etch step, as will be discussed presently.

Figure 5:
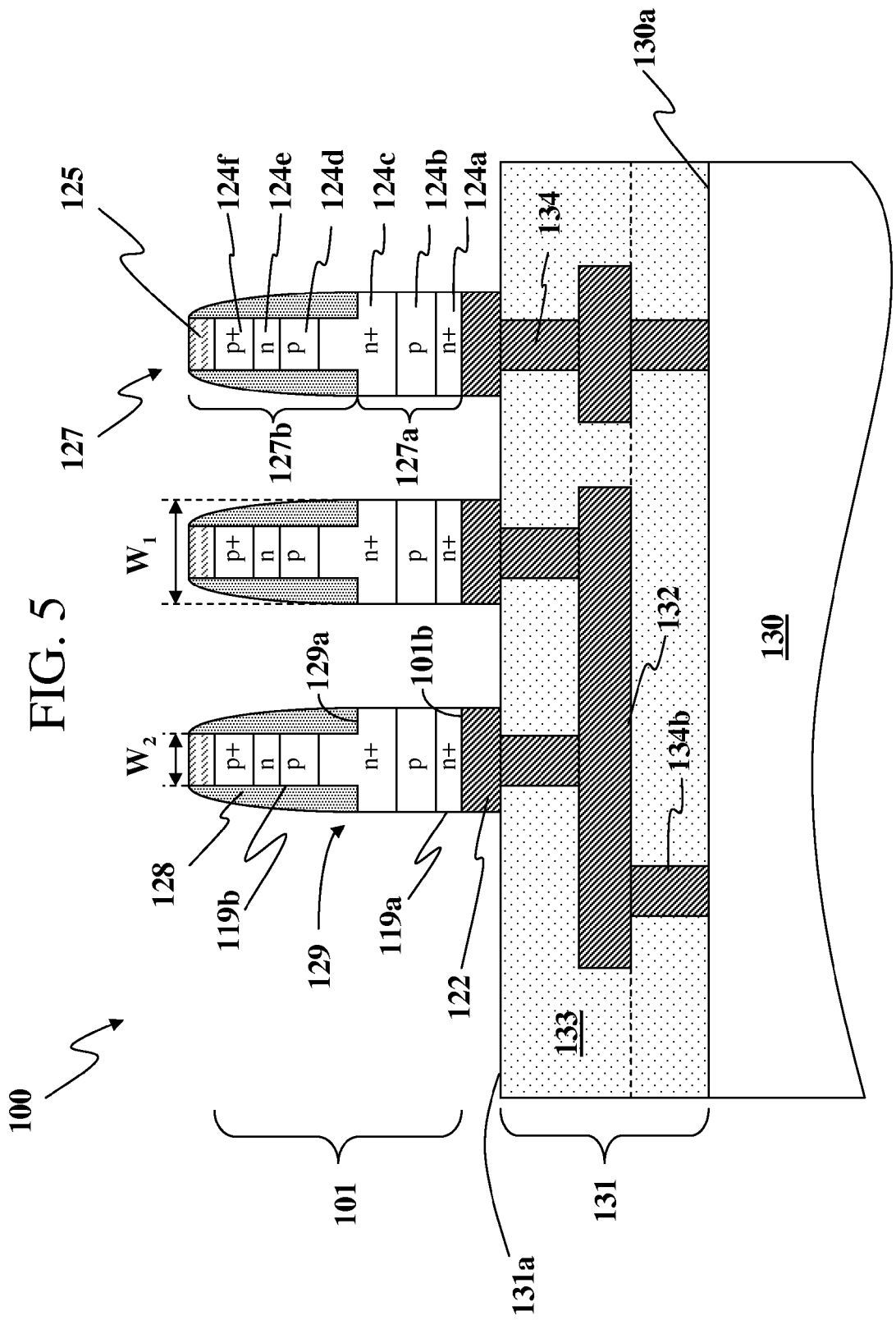

In FIG. 5, device structure 101 is etched again to surface 131a of interconnect region 131 except for portions protected by mask regions 125 and 128. Portions of conductive contact region 121 are etched to form an electrode 122. Hence, electrode 122 corresponds to portions of conductive contact region 121 that are not etched away. Electrode 122 can include many different types of conductive materials, such as a metal. However, electrode 122 includes the same material as conductive contact region 121. In some embodiments, electrode 122 is a metal electrode. Stack 127 now includes a stack region 127a positioned on electrode 122, which is electrically connected to interconnect 132 through vias 134. Stack region 127a is carried by electrode 122. Further, stack region 127a is spaced from via 134 by electrode 122. Stack region 127a is bonded to surface 121a to form a bonding interface therebetween. In some embodiments, the bonding interface is a metal-to-metal bonding interface. Stack 127 also includes a stack region 127b positioned on stack 127a. Stack region 127b is carried by electrode 122 and stack region 127a. Further, stack region 127b is spaced from via 134 by electrode 122 and stack region 127a. It should be noted that interconnect region 131 includes via 134 connected to device structure 101 through electrode 122. In this example, stack 127a is wider than stack 127b so that a ledge 129 is formed therein stack 127. Here, stack 127a has a width $W_1$ and stack 127b has a width $W_2$ where $W_1$ is greater than $W_2$. It should be noted that device structure 101 is etched towards surface 101b, which is a planarized surface in some embodiments, to form stack regions 127a and 127b. Stack 127 includes a planarized surface which faces electrode 122 in the embodiments wherein surface 101b is a planarized surface. Stack 127 includes a planarized surface which faces away from ledge 129 in the embodiments wherein surface 101b is a planarized surface. Stack 127 includes a planarized surface which faces away from stack region 127b in the embodiments wherein surface 101b is a planarized surface. Stack 127 includes a planarized surface which faces interconnect region 131 in the embodiments wherein surface 101b is a planarized surface. Stack 127 includes a planarized surface which faces via 134 in the embodiments wherein surface 101b is a planarized surface. It should be noted that stack region 127a extends between planarized surface 101a and ledge 129.

In particular, stack region 127a includes a planarized surface which faces electrode 122 in the embodiments wherein surface 101b is a planarized surface. Stack region 127a includes a planarized surface which faces away from ledge 129 in the embodiments wherein surface 101b is a planarized surface. Stack region 127a includes a planarized surface which faces away from stack region 127b in the embodiments wherein surface 101b is a planarized surface. Stack region 127a includes a planarized surface which faces interconnect region 131 in the embodiments wherein surface 101b is a planarized surface. Stack region 127a includes a planarized surface which faces via 134 in the embodiments wherein surface 101b is a planarized surface.

Stack regions 127a and 127b include layers of semiconductor materials stacked on top of each other and are defined by sidewalls 119a and 119b, respectively. It should be noted that sidewall 119a extends from surface 101b, which is a planarized surface in some embodiments. Hence, the devices formed from stacks 127a and 127b are called "vertical" devices because their layer structure and sidewalls 119a and 119b extend substantially perpendicular to surface 131a. In other words, the layers of stack 127 are on top of each other so that current flow through pn junctions included therein is substantially perpendicular to surface 131a and parallel to sidewalls 119a and 119b.

This is different from conventional devices which are often called lateral or planar devices. Lateral devices have their layer structure extending horizontally relative to a surface of a material region that carries them. In other words, the pn junctions included in a lateral device are positioned side-by-side so that current flow through them is substantially parallel to the supporting surface.

Figure 6:
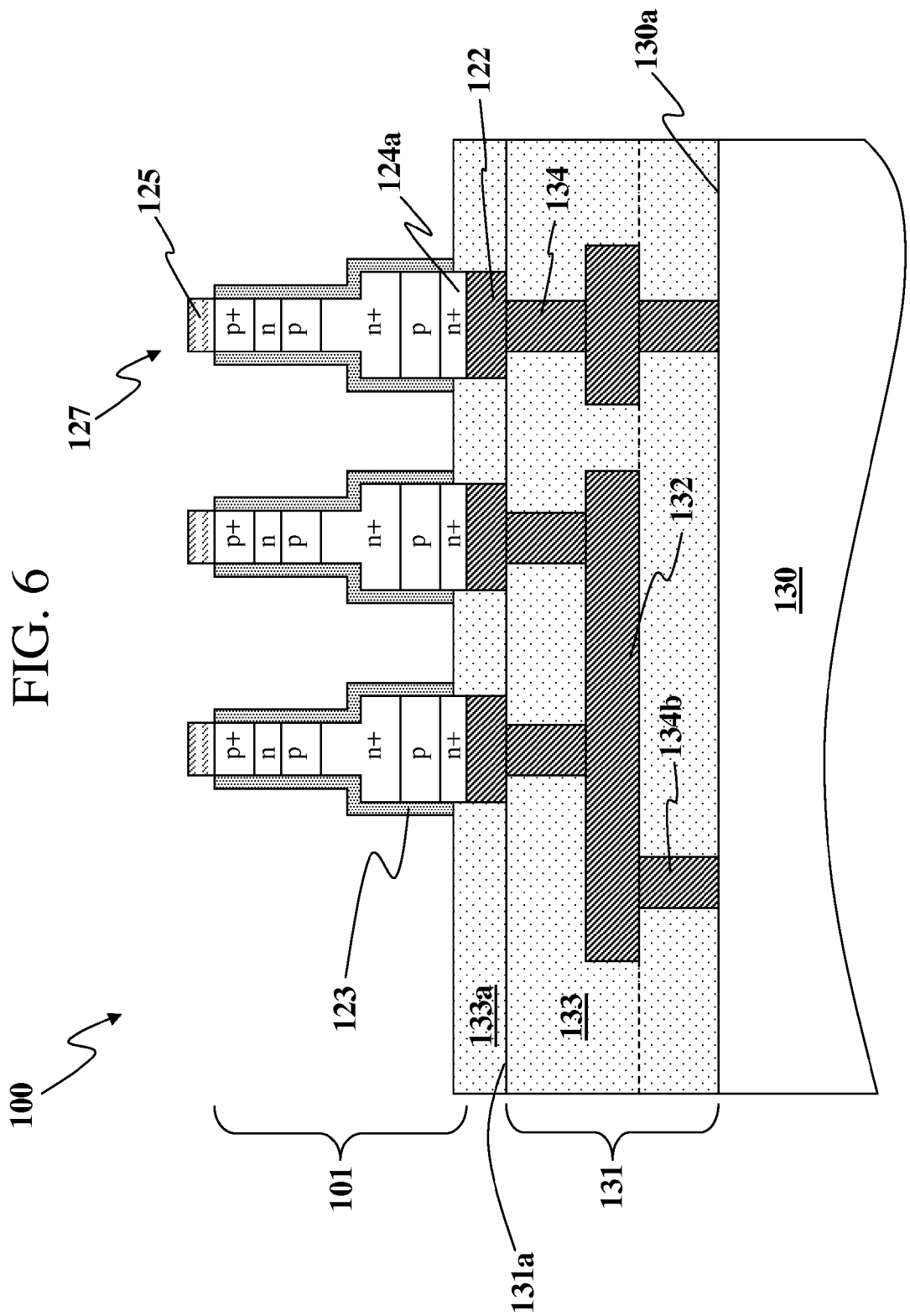

In FIG. 6, a dielectric material region 133a is deposited on interconnect region 131, planarized, and etched back so that it partially surrounds stacks 127. In this embodiment, material region 133a extends up stacks 127 to layers 124a. Material region 133a is processed so that it covers electrodes 122 and prevents oxidation during a gate oxidation process, as will be discussed presently.

A dielectric region 123 is deposited around an outer periphery of each stack 127. Dielectric region 123 can include silicon dioxide, silicon nitride, or combinations thereof. It can also include high dielectric constant (high-k) materials, such as $Al_2O_3$, $ZrO_2$, $HfO_2$, $Y_2O_3$, $La_2O_3$, $Ta_2O_5$, $TiO_2$, and BST (Barium Strontium Titanate). Region 123 can be thermally grown or deposited using thermally evaporation, chemical vapor deposition, physical vapor deposition, or atomic layer deposition. It is beneficial if the thermal growth or deposition can be done using a temperature below about 500° C. so that electrode 122, interconnect region 131, and the electronic circuitry carried by substrate 130 are not damaged or undesirably changed.

Figure 7:
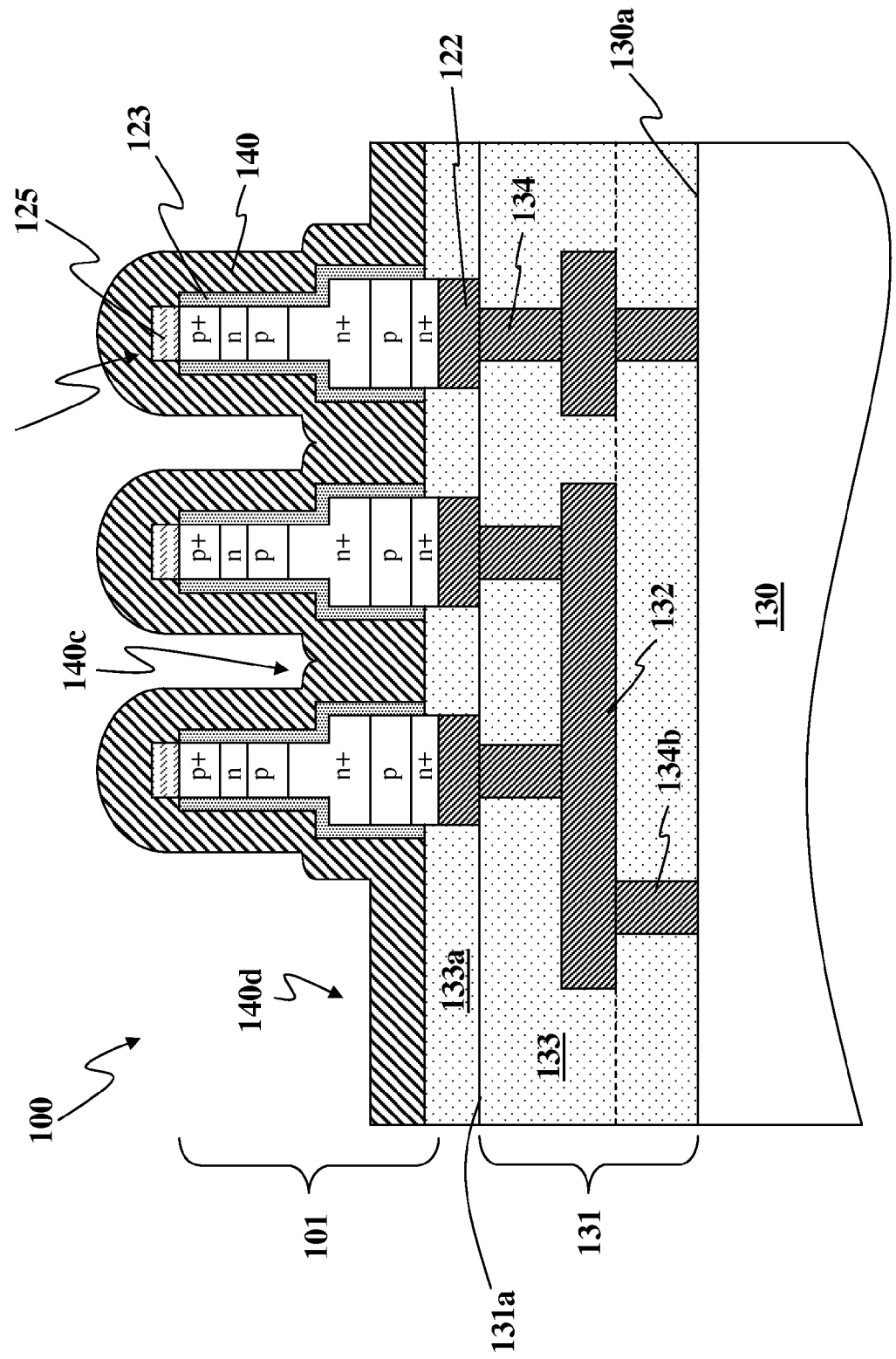

In FIG. 7, a conductive region 140 is positioned on stacks 127 so that it surrounds them. Region 140 is positioned on dielectric material region 133a, hardmask region 125, and dielectric region 123 of each stack. Conductive region 140 can include the same or similar material as those included in vias 134, interconnects 132, and/or region 121. Conductive region 140 operates as a control terminal to modulate the current flow through stack 127. Also, dielectric layer 133a separates bottom electrodes 122 from each adjacent stack 127. Conductive region 140c between stacks 127 is thicker than conductive region 140d because during the deposition process, more conductive material is deposited between adjacent stacks 127.

Figure 8:
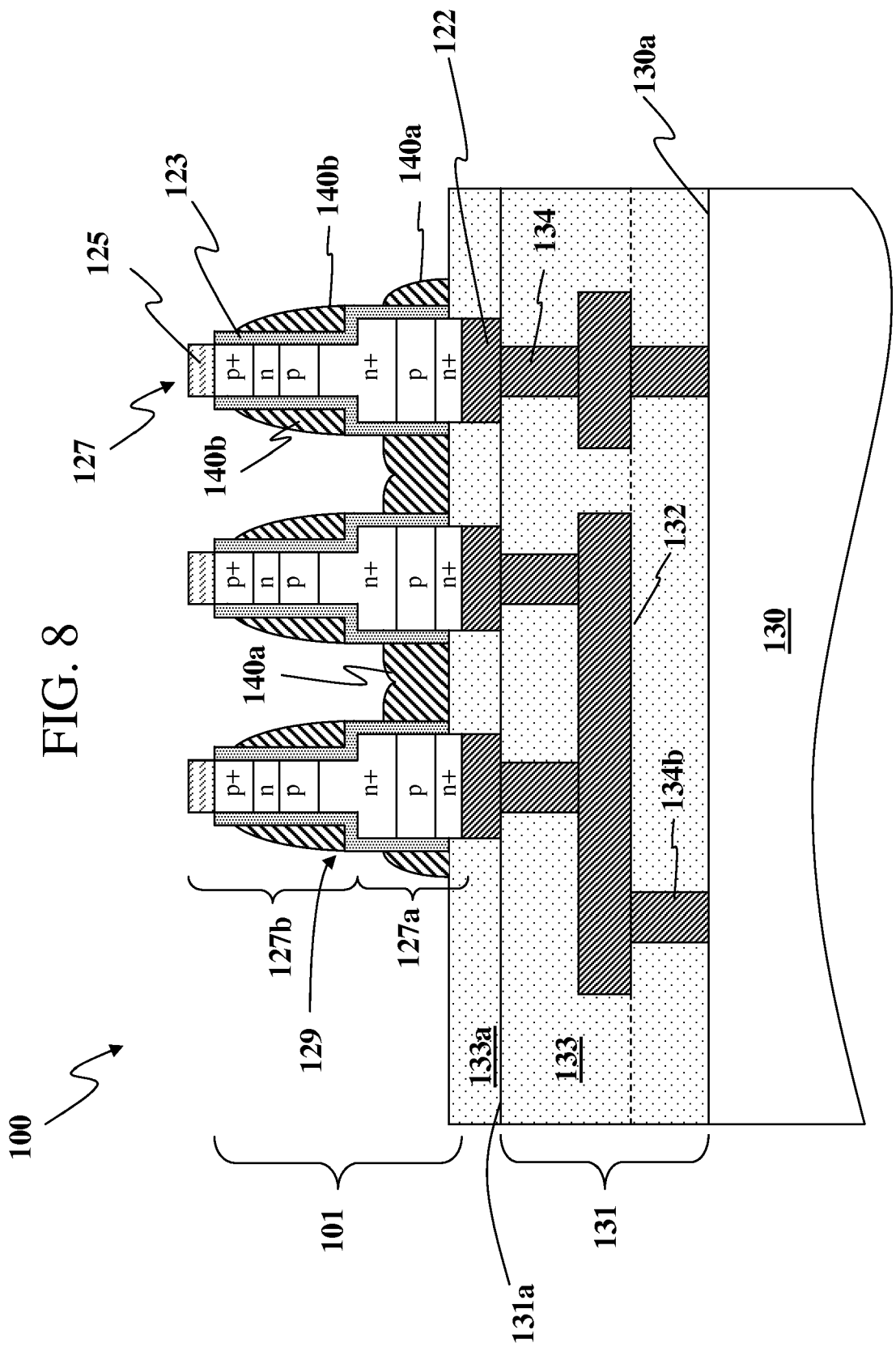

In FIG. 8, conductive region 140 is partially etched away so that portions surrounding stacks 127 remains. After etching, a portion 140a of conductive region 140 remains on region 133a and extends up stack 127a and a portion of conductive region 140b remains on surface 129a of ledge 129 and extends up stack 127b. The etching can be done by anisotropic etching, such as dry etching, and is done in such a way that conductive regions 140a and 140b are not coupled together. Portion 140a couples each adjacent stack 127a together. However, portions 140b of each adjacent stack are not coupled together.

Figure 9:
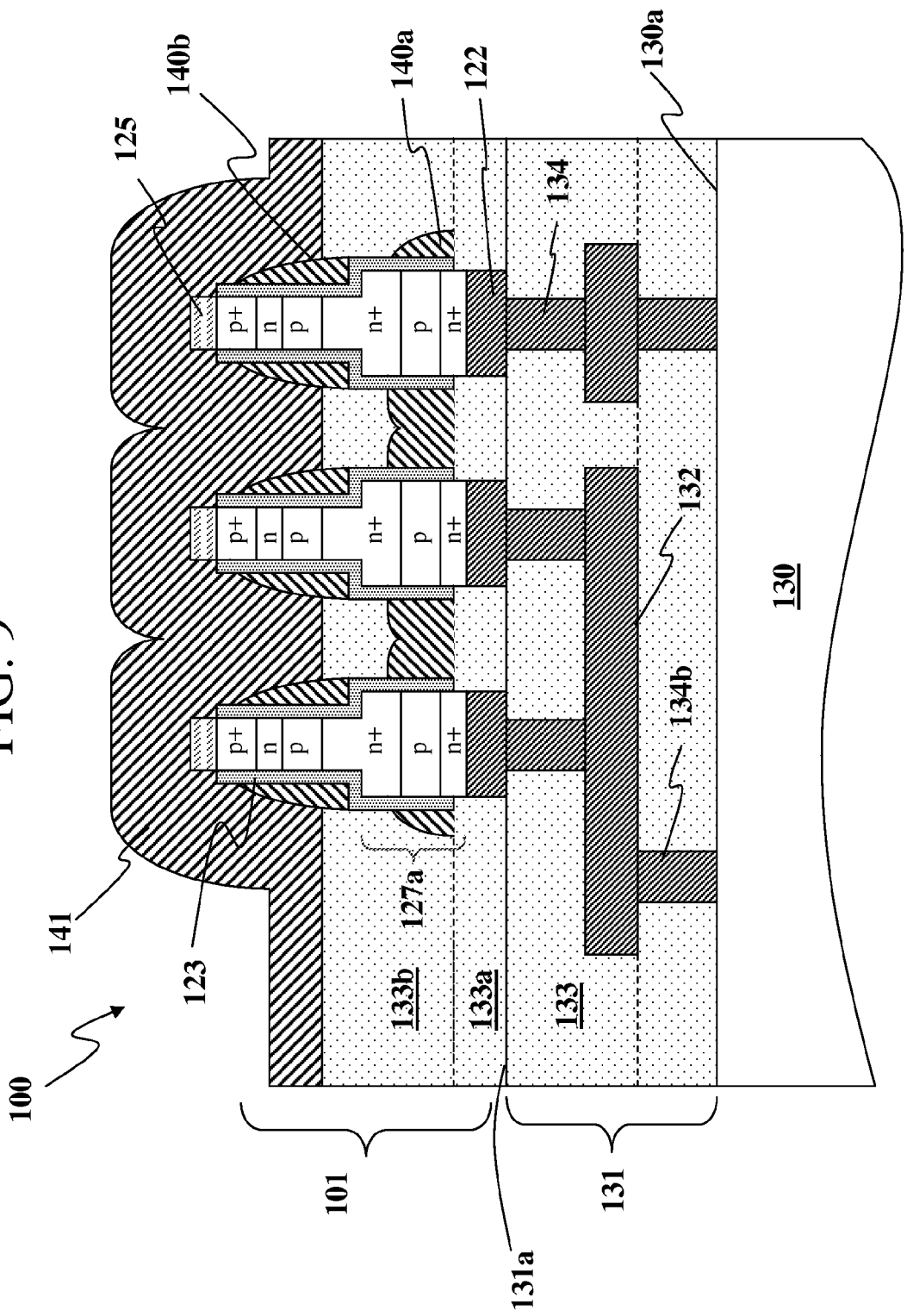
Figure 10:
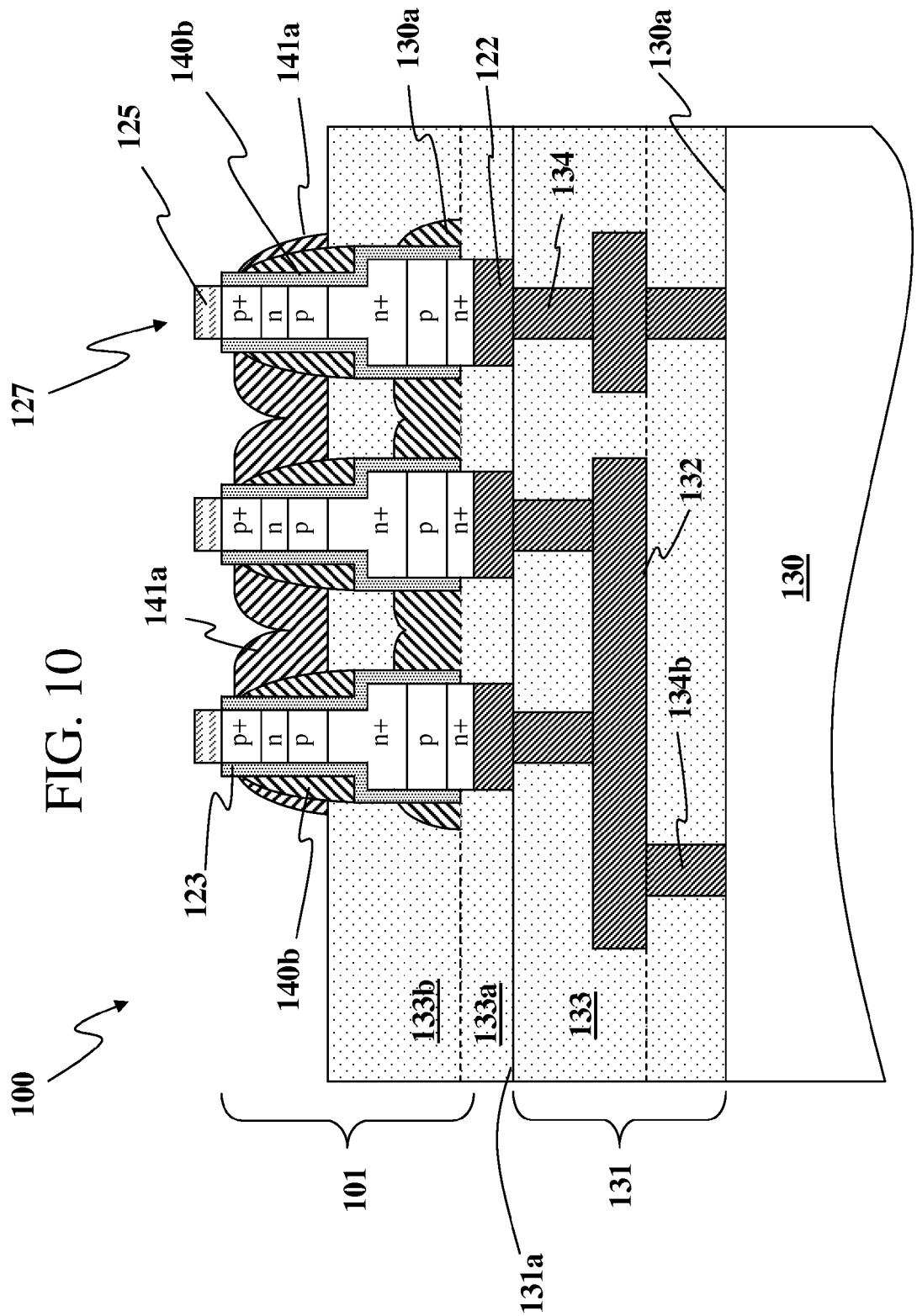

In FIG. 9, a dielectric material region 133b is deposited on dielectric material region 133a and can include the same material. Material region 133b extends up stack 127a to stack 127b. A conductive region 141 is positioned on dielectric material region 133b so that it surrounds stacks 127b. In FIG. 10, conductive region 141 is partially etched away so that portions 141a remain around conductive region 140b and dielectric region 123.

Figure 11:
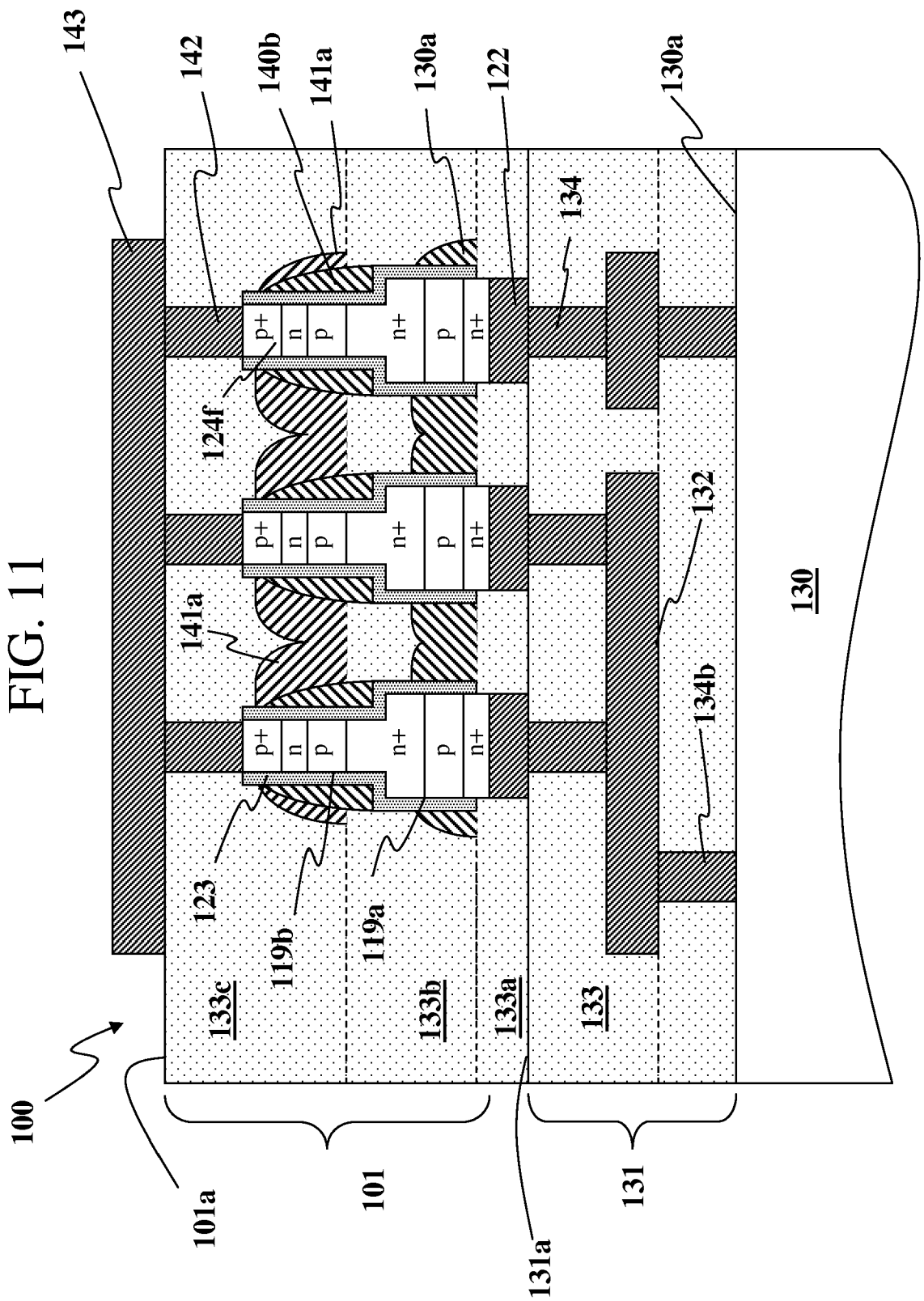

In FIG. 11, a dielectric region 133c is deposited on dielectric region 133b so that it surrounds stacks 127. Dielectric region 133c can include the same material as regions 133, 133a, and/or 133b. Trenches are formed through portions of dielectric region 133c to $p^+$-type region 124f of each stack 127. Contacts 142 are then formed therein so that they extend to a surface 101a of structure 101. A conductive interconnect 143 is formed on surface 101a and is coupled to each via 142. It should be noted that another device structure, similar to device structure 101, can be bonded to conductive interconnect 143 and surface 101a and processed as described above so that multiple layers of devices structures are carried by interconnect region 131.

It should also be noted that sidewalls 119a and 119b of stacks 127a and 127b, respectively, are substantially perpendicular to surface 131a. However, in some embodiments, sidewalls 119a and/or 119b can be oriented at an angle, other than 90°, relative to surface 131a. For example, the angle can be 70° so that the sidewalls of stacks 127a and 127b are sloped relative to surface 131a.

Figure 12:
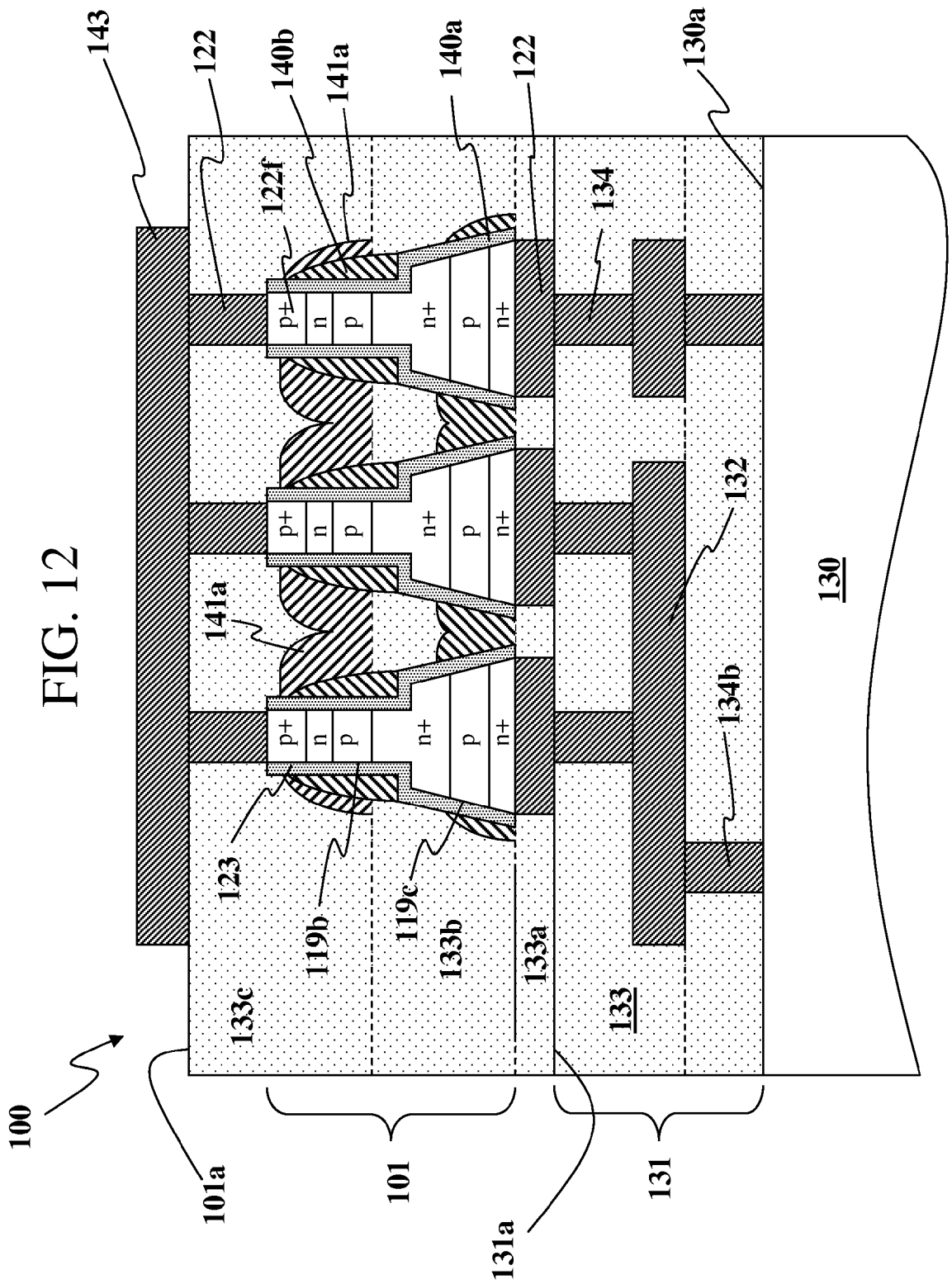
FIG. 12 is simplified sectional views of a memory device having tapered slope in its body in accordance with the present invention.

FIG. 12 shows circuit 100 with stacks 127a and 127b wherein sidewall 119a is sloped and sidewall 119b is perpendicular to surface 131a. If the sidewalls are sloped, then it is easier to deposit material between adjacent stacks 127. Further, conductive contact 121 can be made wider so the alignment is easier during device processing. Sloped sidewalls also increase the stability of stacks 127 even though its aspect ratio is high. The aspect ratio is the ratio of the height of stack 127 between conductive contact 121 and layer 124*f* relative to its width, $W_1$.

Figure 13:
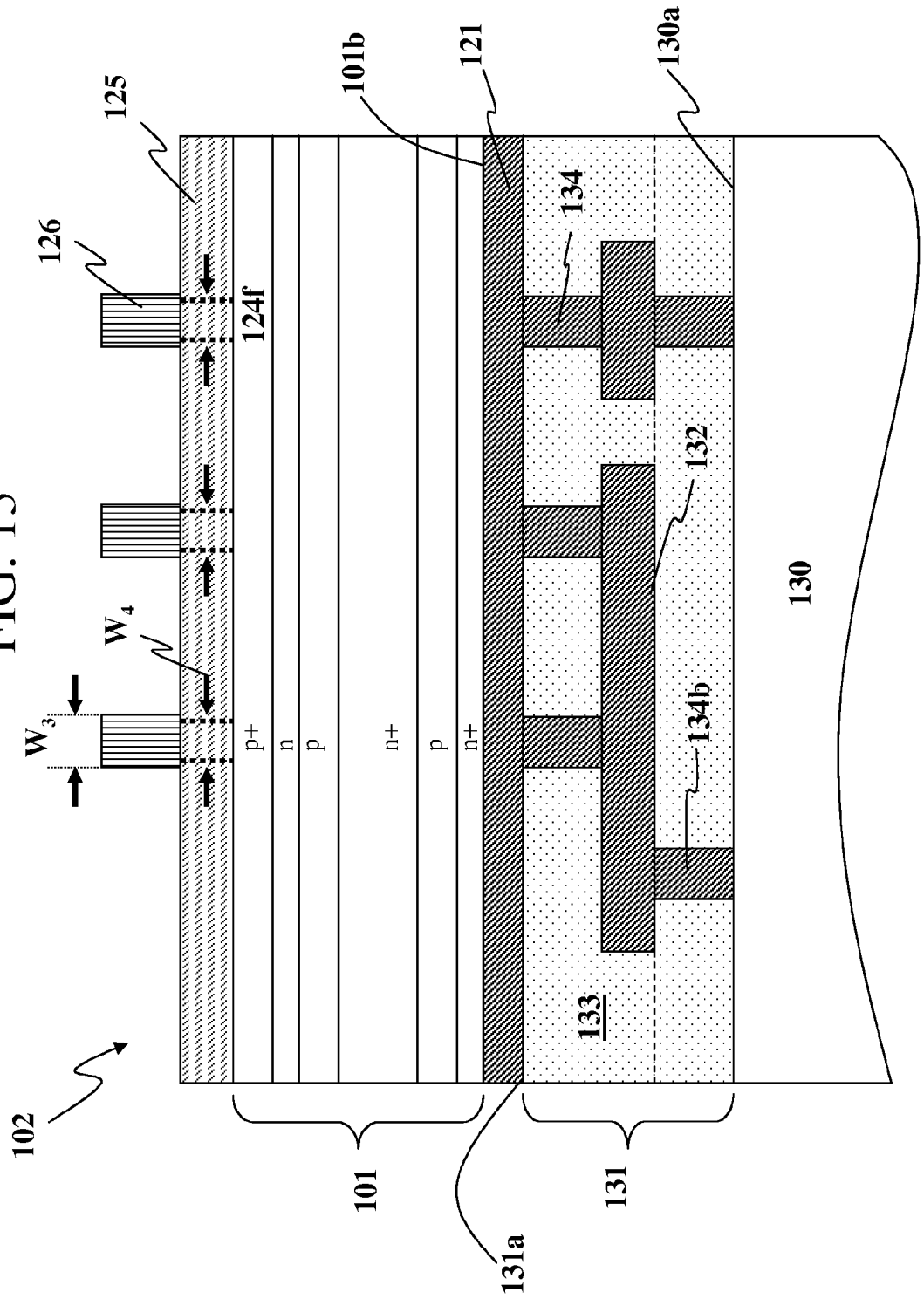
FIGS. 13-14 are simplified sectional views of steps in the fabrication of a memory device with narrowed semiconductor width in accordance with the present invention.
Figure 14:
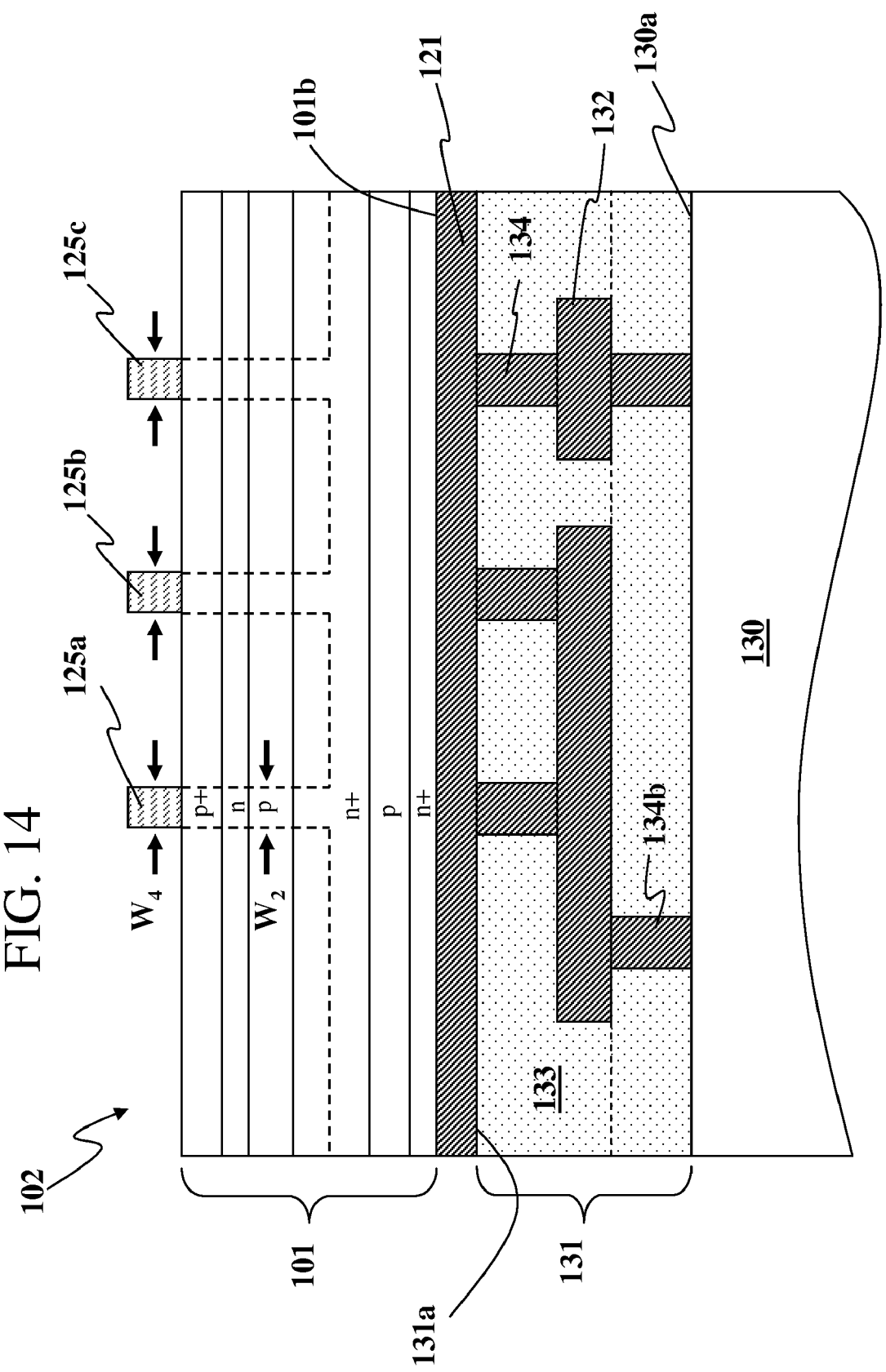

FIGS. 13 and 14 are simplified sectional views of steps in fabricating a semiconductor memory circuit 102 in accordance with the present invention. In FIG. 13, circuit 102 is the same or similar to circuit 100 shown in FIG. 2, only hardmask region 125 is thicker. In this embodiment, hardmask region 125 is exposed and overetched so that the portions of hardmask 125 between photoresist region 126 and layer 124*f* have widths $W_4$, which is less than width $W_2$ as shown in FIG. 5. Overetching undercuts hardmask region 125 so that its width $W_4$ is less than width $W_3$. Since width $W_4$ is made smaller, the width of stack 127*b* will also be made smaller, as shown in FIG. 14. Here, stack 127*b* is shown in phantom with dotted lines. At this point, region 101 can be etched, as shown in FIG. 4, and the processing can move to the subsequent steps described above.

The present invention is described above with reference to preferred embodiments. However, those skilled in the art will recognize that changes and modifications may be made in the described embodiments without departing from the nature and scope of the present invention. Various further changes and modifications will readily occur to those skilled in the art. To the extent that such modifications and variations do not depart from the spirit of the invention, they are intended to be included within the scope thereof.

Having fully described the invention in such clear and concise terms as to enable those skilled in the art to understand and practice the same, the invention claimed is:

The invention claimed is:

1. A semiconductor device, comprising:
   an electrode;
   a first stack of material layers, wherein the first stack is carried by the electrode;
   a second stack of material layers positioned on the first stack, the first and second stacks having different widths; and
   first and second control terminals coupled to the first and second stacks, respectively, so that the first and second stacks each operate as an electronic device;
   wherein one of the first and second stacks operates as a transistor and the other one operates as a negative differential resistance device.

2. The device of claim 1, wherein the negative differential resistance device is a thyristor.

3. The device of claim 1, wherein at least one of the first and second stacks have sidewalls which are tapered.

4. The device of claim 1, wherein the first and second stacks are coupled together so that they operate as a negative differential resistance static random access memory device.

5. A circuit, comprising:
   a substrate which carries electronic devices;
   an interconnect region carried by the substrate, the interconnect region having interconnects coupled to the electronic devices;
   an electrode, which includes a metal; and
   a device structure carried by the electrode, the device structure having a first stack of layers positioned on a second stack of layers, the first stack having a width different from the second stack;
   wherein the device structure is electrically coupled to the electronic devices through the interconnects.

6. The circuit of claim 5, wherein each of the first and second stacks includes at least one pn junction, the current flow through the pn junction(s) being in a direction parallel to a sidewall of the corresponding first and second stack.

7. The circuit of claim 5, wherein one of the first and second stacks operates as a transistor and the other one operates as a negative differential resistance device.

8. The circuit of claim 5, wherein the first and second stacks each have control terminals coupled thereto, the conductance of the first and second stacks being adjustable in response to signals applied to the control terminals.

9. The circuit of claim 5, wherein at least one of the first and second stacks operates as a transistor.

10. The circuit of claim 5, wherein the interconnect region includes a conductive via, and the current flow through the first and second stacks is in a direction substantially parallel to the conductive via.

11. The circuit of claim 5, wherein the device structure includes at least one crystalline semiconductor material layer.

12. A circuit, comprising:
   a substrate;
   an interconnect region carried by the substrate, the interconnect region having an interconnect extending therethrough;
   an electrode, which includes a metal; and
   a device structure bonded to the interconnect through the electrode, the device structure having a first stack of layers positioned on a second stack of layers, the first stack having a width different from the second stack;
   wherein the device structure is electrically coupled to the interconnect.

13. The circuit of claim 12, wherein each of the first and second stacks includes at least one pn junction, wherein the current flow through the pn junction(s) flows through the electrode.

14. The circuit of claim 12, wherein one of the first and second stacks operates as a transistor and the other one operates as a negative differential resistance device.

15. The circuit of claim 12, wherein the first and second stacks each have control terminals coupled thereto, the conductance of the first and second stacks being adjustable in response to signals applied to the control terminals.

16. The circuit of claim 12, wherein at least one of the first and second stacks operates as a transistor.

17. The circuit of claim 12, wherein the device structure includes crystalline semiconductor material.

18. The circuit of claim 12, further including electronic devices carried by the substrate, at least one electronic device being in communication with the device structure through the interconnect region.

19. The circuit of claim 12, wherein the interconnect region includes a conductive via, the current flow through the second stack being in a direction substantially parallel to the conductive via.

20. The device of claim 1, wherein the first and second stacks of material layers include a ledge, the first and second control terminals being positioned on opposite sides of the ledge.

21. The device of claim 1, wherein the first and second stacks of material layers include a ledge, the second control terminal being carried by the ledge.

22. The device of claim 1, wherein the first stack of material layers has a tapered sidewall and the second stack of material layers does not have a tapered sidewall.

23. The circuit of claim 12, wherein the device structure includes a ledge, the electrode being positioned between the interconnect region and the ledge.

24. The circuit of claim 23, further including a control terminal positioned on the ledge.

25. The circuit of claim 23, wherein the first stack of material layers has a tapered sidewall and the second stack of material layers does not have a tapered sidewall.

26. The circuit of claim 12, wherein the width of the electrode corresponds to the width of the first stack of layers.

27. A semiconductor device, comprising:
a first contact region, which includes a metal;
a first stack of semiconductor material layers carried by the first contact region;
a second stack of semiconductor material layers positioned on the first stack, the first and second stacks having different widths; and
first and second control terminals coupled to the first and second stacks, respectively, so that the first and second stacks each operate as an electronic device;
wherein one of the first and second stacks operates as a transistor and the other one operates as a negative differential resistance device.

28. The device of claim 27, further including an interconnect region having an interconnect connected to the first contact region.

29. The device of claim 28, wherein the first contact region and interconnect are coupled together with bonding.

30. The device of claim 29, further including a metal-to-metal bonding interface positioned between the first stack of semiconductor material layers and the interconnect.

31. The device of claim 30, wherein the first control terminal is coupled to the first stack after the bonding interface is formed.

32. The device of claim 30, wherein the first and second stacks are formed to operate as the transistor and negative differential resistance device after the bonding interface is formed.

33. The device of claim 30, wherein the first and second stacks of semiconductor material layers are provided with different widths after the bonding interface is formed.

34. The device of claim 29, further including a second contact region positioned on the second stack of semiconductor material layers.

35. The device of claim 34, wherein the first and second stacks extend between the first and second contact regions.

36. A circuit, comprising:
an interconnect region having a dielectric material region with a via extending therethrough;
an electrode electrically coupled with the via;
a first stack of semiconductor material layers bonded to the via through the electrode; and
a second stack of semiconductor material layers positioned on the first stack;
wherein one of the first and second stacks operates as a transistor and the other one operates as a negative differential resistance device.

37. A semiconductor device, comprising:
an metal electrode; and
a stack of semiconductor material layers which operates as first and second electronic devices, the first and second electronic devices including first and second control terminals, respectively, wherein the stack is carried by the metal electrode;
wherein the stack includes a ledge with the first and second control terminals being positioned on opposite sides of the ledge.

38. The device of claim 37, further including a bonding interface, wherein the stack extends from the bonding interface.

39. The device of claim 38, wherein the first and second electronic devices are formed after the bonding interface is formed.

40. The device of claim 37, further including a bonding interface.

41. The device of claim 40, wherein a current flow through the bonding interface is adjustable in response to adjusting a signal applied to the first control terminal.

42. The device of claim 37, further including a bonding interface adjacent to the metal electrode.

43. The device of claim 37, wherein a current flow through the metal electrode is adjustable in response to adjusting a signal applied to the first control terminal.

44. The device of claim 1, further including a ledge.

45. The device of claim 44, further including a bonding interface between the electrode and first stack.

46. The device of claim 45, wherein the first stack extends between the bonding interface and ledge.

47. The device of claim 45, wherein the conductivity of the first stack is adjustable in response to adjusting a signal applied to the first control terminal.

48. The device of claim 44, wherein the first stack extends between the electrode and ledge.

49. The device of claim 48, wherein the conductivity of the first stack is adjustable in response to adjusting a signal applied to the first control terminal.

50. A semiconductor device, comprising:
an electrode, which includes a metal;
a first stack of material layers, wherein the first stack is carried by the electrode;
a second stack of material layers carried by the first stack;
first and second control terminals coupled to the first and second stacks, respectively; and
a ledge positioned between the first and second control terminals.

51. The device of claim 1, wherein the first and second stacks are carried by the electrode.

52. The device of claim 1, wherein the electrode includes a metal.

53. The device of claim 1, wherein the electrode is a metal electrode.

54. The device of claim 1, wherein the first stack includes a planarized surface, which faces the electrode.

55. The device of claim 53, further including a bonding interface proximate to the planarized surface.

56. The device of claim 54, wherein the bonding interface is a metal-to-metal bonding interface.

57. The circuit of claim 5, wherein the device structure includes a planarized surface which faces the interconnect region.

58. The circuit of claim 57, further including a bonding interface proximate to the planarized surface.

59. The circuit of claim 58, wherein the bonding interface is a metal-to-metal bonding interface.

60. The circuit of claim 5, wherein the interconnect region includes a via connected to the device structure through the electrode.

61. The circuit of claim 60, wherein the device structure includes a planarized surface which faces the via.

62. The circuit of claim 61, further including a bonding interface proximate to the planarized surface.

63. The circuit of claim 62, wherein the bonding interface is a metal-to-metal bonding interface.

64. The circuit of claim 5, wherein the electronic devices are included with a CMOS circuit.

65. The circuit of claim 12, further including a CMOS circuit carried by the substrate, wherein the CMOS circuit includes the electronic devices.

66. The circuit of claim 12, wherein the first stack includes a planarized surface which faces the first contact region.

67. The circuit of claim 12, wherein the first stack includes a planarized surface which faces the contact region.

68. The device of claim 37, wherein the stack includes a planarized surface, and the first electronic device extends between the ledge and planarized surface.

69. The device of claim 50, wherein the first stack includes a planarized surface.

70. The device of claim 50, wherein the first stack includes a planarized surface which faces away from the second stack.

71. The circuit of claim 36, wherein the first stack is carried by the electrode.

72. The circuit of claim 36, wherein the interconnect region includes a via connected to the first stack through the electrode.

73. The circuit of claim 10, wherein the electrode extends between the conductive via and first stack.

74. The device of claim 37, further including a bonding interface established by the electrode.

* * * * *